(12) United States Patent
Liu

(10) Patent No.: US 7,342,521 B1
(45) Date of Patent: Mar. 11, 2008

(54) SYSTEM AND METHOD FOR MULTI-CHANNEL DELAY CELL BASED CLOCK AND DATA RECOVERY

(75) Inventor: Yin Liu, Fremont, CA (US)

(73) Assignee: Chrontel, Inc., San Jose, CA (US)

( * ) Notice: Subject to any disclaimer, the term of this patent is extended or adjusted under 35 U.S.C. 154(b) by 0 days.

(21) Appl. No.: 11/477,285

(22) Filed: Jun. 28, 2006

(51) Int. Cl.
*H03M 9/00* (2006.01)
(52) U.S. Cl. ...................... 341/100; 341/147
(58) Field of Classification Search ................ 341/100, 341/101; 327/147, 145, 141, 144
See application file for complete search history.

(56) References Cited

U.S. PATENT DOCUMENTS

| | | | |
|---|---|---|---|
| 5,953,386 A * | 9/1999 | Anderson | 375/376 |
| 6,624,766 B1 * | 9/2003 | Possley et al. | 341/69 |
| 6,628,214 B1 * | 9/2003 | Kawase et al. | 341/100 |
| 6,707,399 B1 * | 3/2004 | Wang et al. | 341/100 |
| 6,911,923 B1 * | 6/2005 | Wang et al. | 341/100 |
| 7,031,421 B2 * | 4/2006 | Marx et al. | 375/376 |
| 2002/0064175 A1 * | 5/2002 | Traverso et al. | 370/442 |
| 2002/0075981 A1 * | 6/2002 | Tang et al. | 375/372 |
| 2005/0040876 A1 * | 2/2005 | Jeon | 327/291 |

* cited by examiner

*Primary Examiner*—Peguy JeanPierre
(74) *Attorney, Agent, or Firm*—Carr & Ferrell

(57) ABSTRACT

Systems and methods regarding the restoration of serialized data to parallel data with a low speed reference signal are provided. In exemplary embodiments, a phased lock loop receives a reference clock signal from a data source and generates a reference high speed clock signal based on the reference clock signal. A dynamic link library clock and data recovery module reads and writes data flows contained within serialized data onto parallel data paths at a modified high speed clock signal based on the reference high speed clock signal.

22 Claims, 6 Drawing Sheets

SYSTEM AND METHOD FOR MULTI-CHANNEL DELAY CELL BASED CLOCK AND DATA RECOVERY

BACKGROUND OF THE INVENTION

1. Field of the Invention

Embodiments of the present invention relates generally to clocks and data recovery, and more particularly, to multi-channel delay cell based clocks and data recovery.

2. Background Art

Typically, data is commonly processed in parallel within computers. When transmitting data from one computer to another, however, data is generally sent in serial to save on interconnection pins and to reduce errors in transmission. For example, ten data streams, each within a separate parallel channel, may be processed by a computer. The ten separate data streams may be serialized into a single high speed channel and transmitted to a receiving computer. The receiving computer may then separate the ten data streams back into parallel channels for further processing. Unfortunately, if the clock cycle of the receiving computer is not in phase with the serialized data, errors in reading the serialized data can occur.

In high speed serialized data transmission, a high speed clock signal is not normally provided between the two computers due to difficulties in maintaining a fixed timing relationship between the high speed clock signal and the serialized data. If a high speed clock signal is transmitted to the receiving computer, the high speed clock signal can jitter in transmission. Jitter refers to timing errors. Jitter may be caused by electromagnetic interference (EMI), crosstalk with other signals, or any other noise. When a high speed clock signal jitters out of phase with the serialized data, the receiving computer attempting to separate the serialized data into parallel channels based on the high speed clock cycle may encounter errors or data corruption.

Therefore, there is a need to restore parallel data from transmitted serialized data using a clock signal from the device that generated the serialized data.

SUMMARY OF THE INVENTION

Embodiments of the present invention can overcome or substantially alleviate prior problems associated with restoring serialized data to parallel data utilizing a low speed reference clock signal.

In exemplary embodiments, a phased lock loop receives a reference clock signal from a data source and generates a reference high speed clock signal based on the reference clock signal. The phased lock loop also generates a clock control signal based on the reference clock signal. A dynamic link library clock and data recovery module reads and writes data flows contained within serialized data onto parallel data paths at a modified high speed clock signal based on the reference high speed clock signal.

In various embodiments, the dynamic link library clock and recovery module comprises a bang-bang phase detector, a charge pump, a voltage control delay block and a demultiplexer. The bang-bang phase detector samples the serialized data containing the data flows at the reference high speed clock signal to determine transition information. The charge pump generates a feedback signal based on this transition information. The voltage control delay block then combines the feedback signal from the charge pump and the clock control signal from the phased lock loop to form a modification control signal. The voltage control delay block also modifies the reference high speed clock signal based on the modification control signal to create the modified high speed clock signal. The demultiplexer reads and writes the data flows contained within the serialized data at the modified high speed clock signal.

DESCRIPTION OF EXEMPLARY EMBODIMENTS

The present invention provides exemplary systems and methods for multi-channel delay cell based clock and data recovery. In exemplary embodiments, multi-channel serialized data is restored to parallel data by utilizing, in part, a low speed reference clock. Advantageously, exemplary embodiments are configured to correct or overcome low frequency jitter caused by a reference clock generated by the same source as the multi-channel serialized data.

Figure 1:
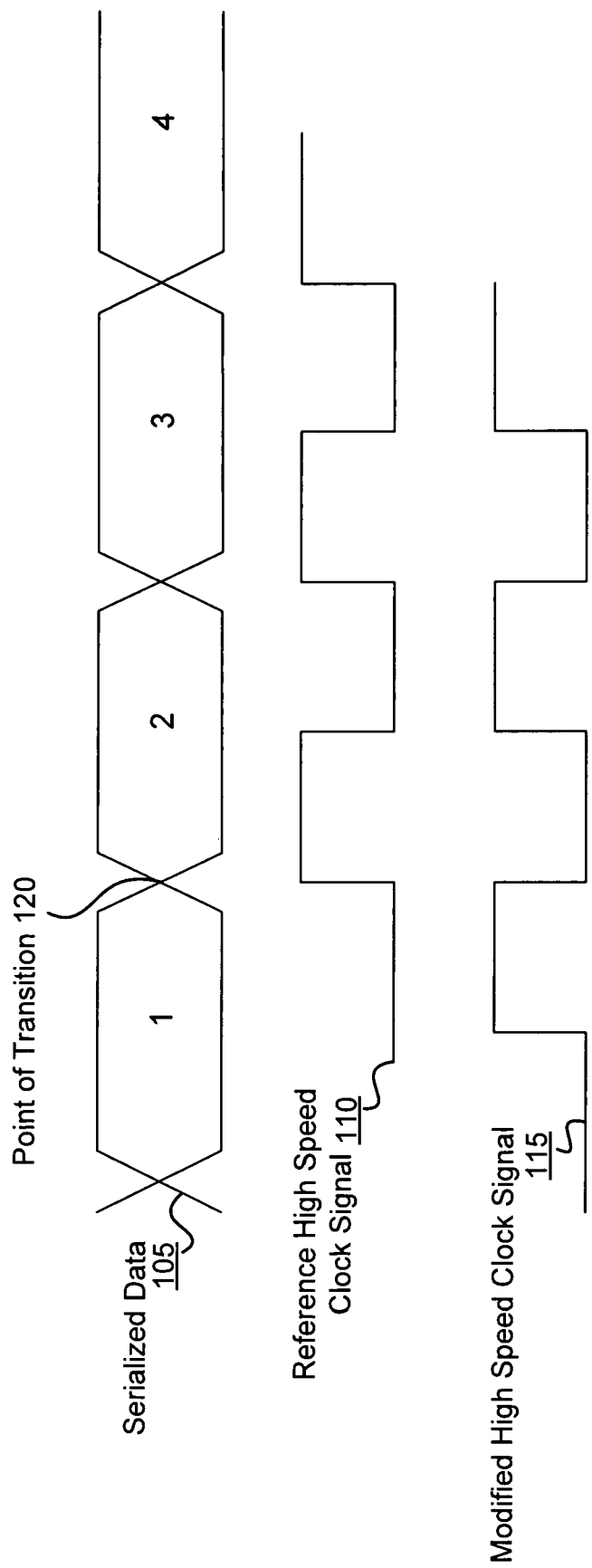
FIG. 1 is a diagram of serialized data from a single channel, an exemplary reference high speed clock signal, a modified high speed clock signal, and a plurality of points of transition according to one embodiment of the present invention.

Referring to FIG. 1, a diagram of serialized data 105 from a single channel, an exemplary reference high speed clock signal 110, a modified high speed clock signal 115, and a plurality of points of transition 120 according to one embodiment of the present invention is shown. In exemplary embodiments, a transmitting digital device serializes parallel data and transmits the serialized data 105 to a receiving digital device. The digital devices may be any device with a processor (e.g., a computer, personal digital assistant, cell phone, MP3 player, television, game system). In other embodiments, serialized data 105 is stored within a storage device (e.g., hard drive, random access memory, flash memory). The serialized data 105 shown in FIG. 1 is depicted as a superposition of successive pulses as would be observed on an oscilloscope whose time base is triggered by a receiver after predetermined periods of time.

Each number depicted within the serialized data 105 (e.g., "1", "2") represents discrete datum of a data flow. In one example, there are ten data flows contained within the serialized data 105. Discrete datum "1" of the serialized data 105 belongs to a first data flow, discrete datum "2" belongs to a second data flow, and so forth. Since there are ten data flows, discrete datum "11" is the next discrete datum that belongs to the first data flow.

In exemplary embodiments, the serialized data 105 is restored to parallel data. Thus, a first parallel data path can receive discrete datum of the first data flow (e.g., discrete data "1", "11", "21", etc. in the example) while a second parallel data path can receive discrete datum of the second data flow (e.g., discrete data "2", "12", "22", etc. in the example) and so forth. In further embodiments, the serialized data 105 may comprise any number of data flows.

The reference high speed clock signal 110 can be generated by the receiving digital device or, alternatively, received from the transmitting digital device that generates the serialized data 105. The reference high speed clock signal 110, however, can become out of phase from the serialized data 105. As a result, reading the serialized data 105 based on the reference high speed clock signal 110 can produce errors. For example, if an edge of the reference high speed clock signal 110 rises at a point of transition 120 within the serialized data 105 (e.g., where discrete datum "1" becomes discrete datum "2"), errors in reading the parallel data may occur.

A modified high speed clock signal 115 may be generated to maintain a fixed phase relationship to the serialized data 105. In some embodiments, a high speed clock signal is maintained in a fixed phase relationship with a reference clock signal. The reference clock signal is generated and transmitted by the transmitting digital device that generated the serialized data 105. The serialized data 105 can be sampled and the high speed clock modified until the rising edges of the delayed high speed clock are timed to avoid the points of transition 120 within the serialized data 105. In one example, the modified high speed clock signal 115 is centered between the two points of transition 120 around each discrete datum of the serialized data 105.

It will be appreciated by those skilled in the art that data may be read on a falling edge of the clock cycle as well as the rising edge of the clock cycle. If the data within the serialized data 105 is read on the falling edge of the modified high speed clock signal 115, then the falling edge may be centered between the two points of transition 120 around each discrete datum.

Figure 2:
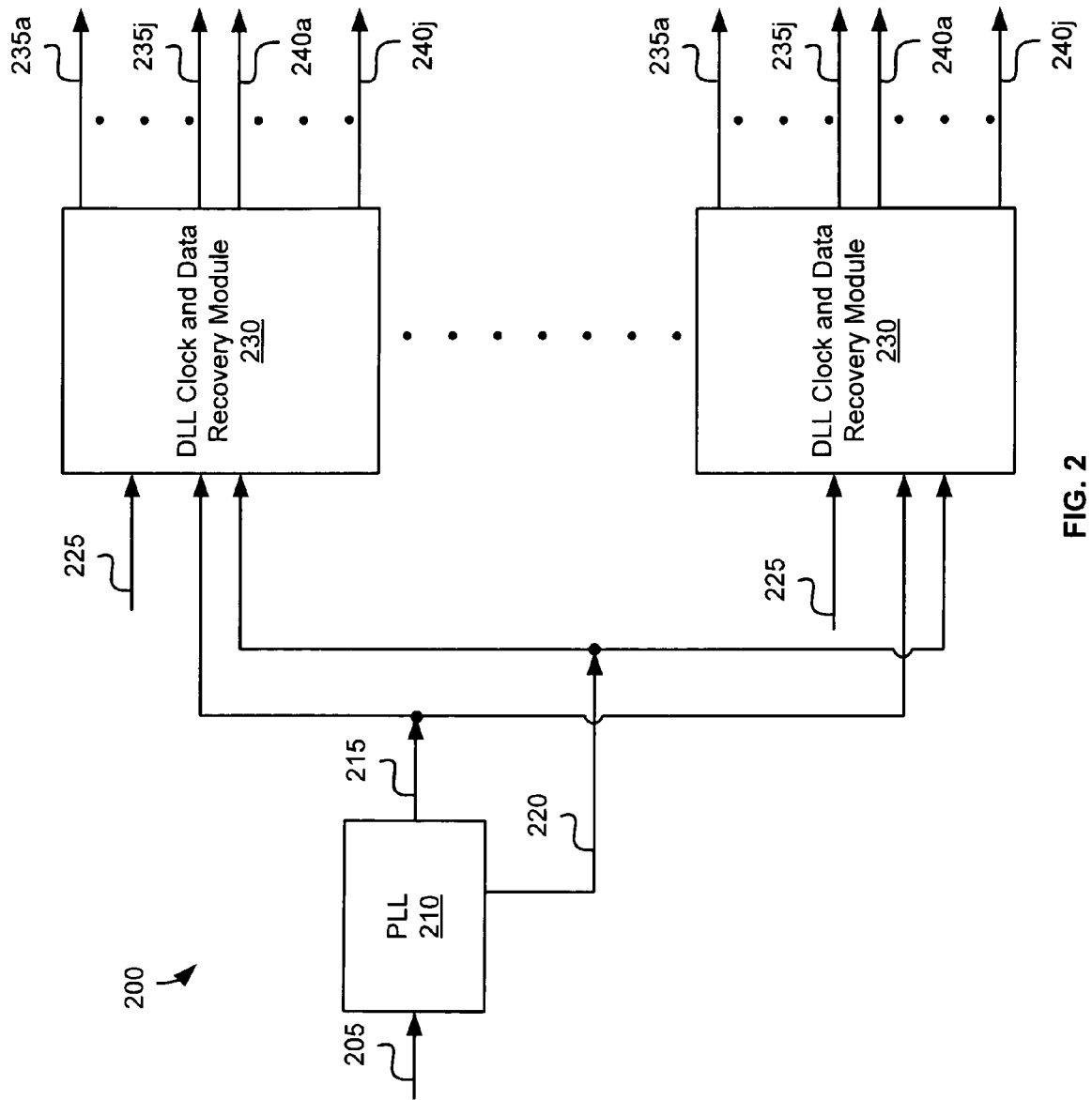
FIG. 2 is a block diagram of an exemplary environment in which an embodiment of the present invention may be practiced.

Referring to FIG. 2, a block diagram of an exemplary environment 200 in which an embodiment of the present invention may be practiced is shown. In exemplary embodiments, the environment 200 occurs in a receiving digital device. The receiving digital device receives serialized data 105 and a reference clock signal from a transmitting digital device. A reference high speed clock signal is generated based on the reference clock signal. The reference high speed clock signal is then modified until a rising edge of each clock cycle of the modified high speed clock signal is between the points of transition 120 (FIG. 1) of each discrete datum within the serialized data 105. The serialized data 105 is then read based on the modified high speed clock signal 115 and written to parallel paths 235a through 235j.

The PLL 210 may be any phased-lock loop circuit that is configured to maintain a generated signal (e.g., reference high speed clock signal) in a fixed phase relationship to a reference signal (e.g., reference clock signal) through a closed-loop feedback control system and output the generated signal as well as a clock control voltage. In one example, a digital data source (not shown) generates and transmits multiple channels of different serialized data 105 and a reference clock signal to the exemplary environment 200.

Each channel of the serialized data 105 may be received by a different DLL clock and recovery module 230 over a different serialized data path 225. The reference clock signal, however, is received by the PLL 210 over the reference clock signal path 205. Although only two DLL clock and recovery modules 230 are depicted in FIG. 2, there may be any number of DLL clock and recovery modules 230 (e.g., a module 230 for every channel of serialized data.)

After receiving the reference clock signal, the PLL 210 produces and outputs the reference high speed clock signal over a high speed clock signal path 215. In some embodiments, each reference clock signal is divided into equal periods to produce the reference high speed clock signal. The number of equal periods is equivalent to the number of separate data flows within one channel of the serialized data. For example, if there are ten separate data flows contained within the serialized data 105, then the reference clock signal is divided into ten equal periods and transmitted over the high speed clock signal path 215 to the DLL clock and data recovery module 230. As a result, the high speed clock signal is ten times faster than the reference clock signal. In other embodiments, the reference clock signal is divided into any number of periods and sent over the high speed clock signal path 215. Further, the division of the reference clock signal may be independent of the number of data flows contained within the serialized data 105.

The clock control signal corresponds to an operating frequency of the PLL 210. In some embodiments, the clock control signal controls the PLL 210's voltage controlled oscillator in order to divide the reference clock signal into the high speed clock signal. In one example, the clock control signal controls an inverter ring structure within the PLL 210's voltage controlled oscillator. The PLL 210 outputs the clock control signal over clock control signal path 220.

The DLL clock and data recovery module 230 converts the serialized data 105 received over serialized data path 225 to parallel data and writes the parallel data over parallel data paths 235a through 235j. The DLL clock and data recovery module 230 can also output system clock signals over the system clock signal paths 240a through 240j. Although ten parallel data paths are depicted in FIG. 2 (i.e., parallel data paths 235a through 235j), there may be any number of parallel data paths. For example, the number of parallel data paths may be equal to the number of data flows within the serialized data 105 received by the DLL clock and data recovery module 230 over the serialized data path 225. Similarly, although ten system clock signal paths 240a through 240j are depicted in FIG. 2, there may be any number of system clock signal paths. In some embodiments, the number of parallel data paths is equal to the number of system clock signal paths.

Moreover, although two DLL clock and data recovery modules 230 with an equal number of parallel data paths 235a through 235j are depicted in FIG. 2, the number of parallel data paths for each DLL clock and data recovery module 230 may be independent of each other. In one example, the number of parallel data paths may be equal to the number of data flows within the serialized data 105 received by the DLL clock and data recovery module 230.

In some embodiments, each DLL clock and data recovery module 230 may receive serialized data 105 with a different number of data flows. As a result, each DLL clock and data recovery module 230 may have a different number of parallel data paths. In an alternate embodiment, there may be a plurality of DLL clock and data recovery modules 230 with an equal number of parallel data paths 235a through 235j. If a DLL clock and data recovery module 230 receives serialized data 105 with fewer data flows than parallel data paths 235a through 235j, then some of the parallel data paths 235a through 235j may go unused. The DLL clock and data recovery modules 210 will be discussed in more detail in connection with FIG. 3.

Figure 3:
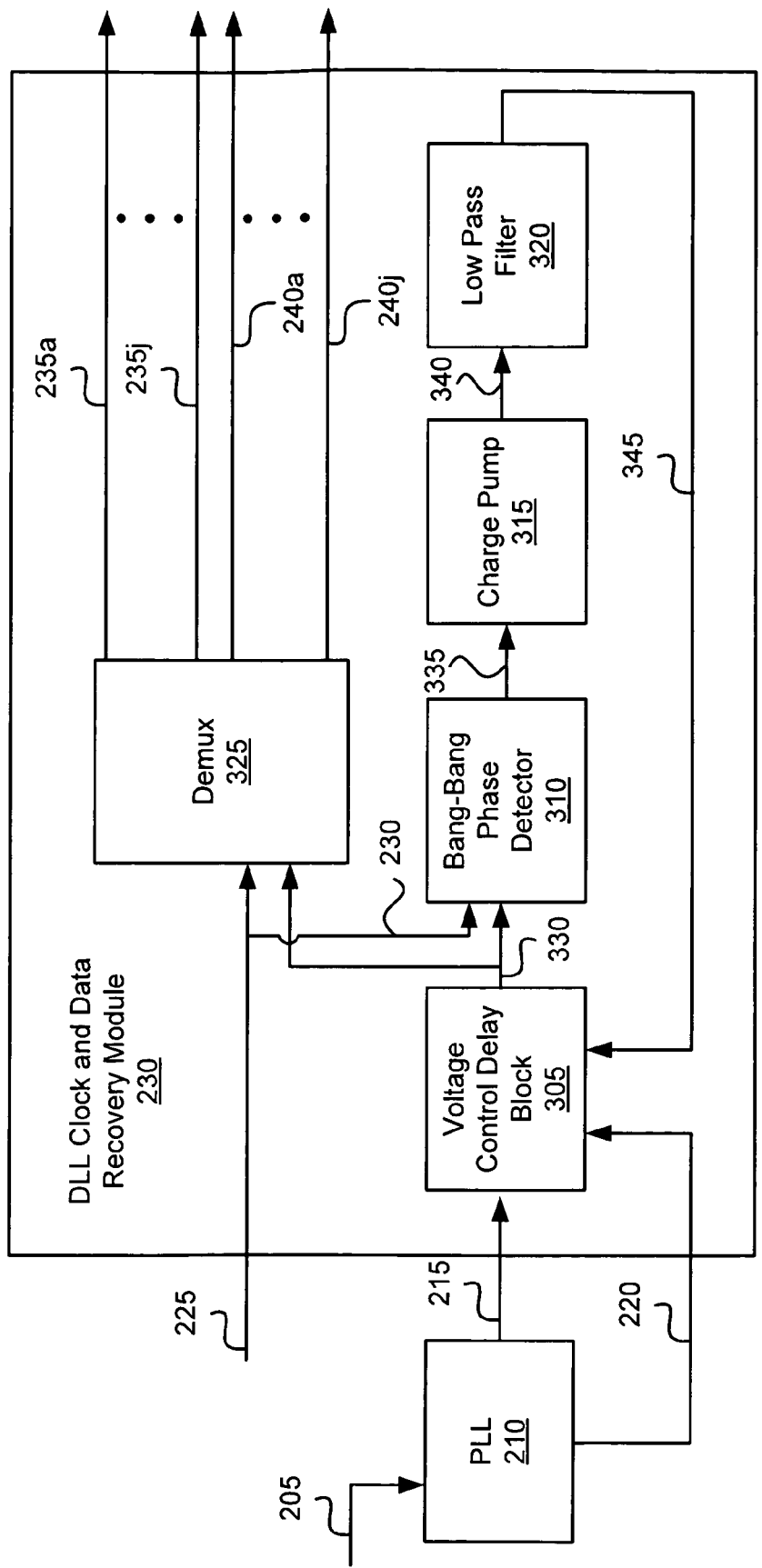
FIG. 3 is a more detailed block diagram of an exemplary dynamic link library clock and data recovery module according to one embodiment of the present invention.

Referring now to FIG. 3, a more detailed block diagram of the exemplary DLL clock and data recovery module 230 according to one embodiment of the present invention is shown. As discussed with reference to FIG. 2, the PLL 210 receives the reference clock signal over the reference clock signal path 205 and outputs the reference high speed clock signal over the high speed clock signal path 215 as well as the clock control signal over the clock control signal path 220. The DLL clock and data recovery module 230 receives the serialized data 105 (FIG. 1) via the serialized data path 225, the reference high speed clock signal via high speed clock signal path 215, and the clock control signal via the clock control signal path 220.

The exemplary DLL clock and data recovery module 230 comprises a voltage control delay block 305, a bang-bang phase detector 310, a charge pump 315, an optional low pass filter 320, and a demultiplexer ("demux") 325. The voltage control delay block 305, the bang-bang phase detector 310, the charge pump 315, and the optional low pass filter 320 are utilized to modify the reference high speed clock signal from the PLL 210. The modified high speed clock signal is subsequently used when the demux 325 reads the serialized data 105 (FIG. 1). The process of modifying the reference high speed clock signal can be based on continuous sampling of the serialized data 105 (FIG. 1).

The voltage control delay block 305 receives both the reference high speed clock signal and the clock control signal from the PLL 210. The voltage control delay block 305 initially utilizes the clock control signal to modify a delay of the high speed clock signal. The voltage control delay block 305 subsequently receives a feedback signal over feedback signal path 345. The feedback signal and the clock control signal can be used to modify the reference high speed clock signal as will be described below. The voltage control delay block 305 outputs the modified high speed clock signal to modified high speed clock signal path 330.

The bang-bang phase detector 310 receives the modified high speed clock signal from the voltage control delay block 305 and the serialized data 105 (FIG. 1) via a serialized data path 225. The bang-bang phase detector 310 samples the serialized data 105 at the modified high speed clock signal. The bang-bang phase detector 310 determines if the clock edge of the modified high speed clock signal is late or early compared to the point of transition 120 (FIG. 1) within the serialized data 105 and sends transition information over a transition information path 335 to the charge pump 315.

The transition information controls the charge pump 315. In one embodiment, the charge pump 315 converts voltage from the transition information into a feedback signal and optionally outputs the feedback signal over a transition path 340. In other embodiments the feedback signal is output directly to a feedback signal path 345. In further, alternative embodiments, the charge pump 315 converts current from the transition information into the feedback signal. The charge pump 315 may comprise capacitors as energy storage elements.

The optional low pass filter 320 receives the feedback signal and filters the higher frequencies from the feedback signal before outputting the feedback signal over the feedback signal path 345. In some embodiments, the optional low pass filter 320 filters the feedback signal to reduce jitter by smoothing pulses from the charge pump 315. Alternately, the low pass filter 320 is replaced by a capacitor to further smooth pulses from the charge pump 315. In one example, one or more capacitors are added to the optional low pass filter 320.

The feedback signal and the clock control signal may combine within the voltage control delay block 305 in order to modify the high speed clock signal. In some embodiments, the clock control signal is a minimum voltage used to delay the high speed clock signal. The feedback signal may be combined to the clock control signal to further delay the modified high speed clock signal to better sample the serialized data 105. For example, if the bang-bang phase detector 310 detects that the modified high speed clock signal is too slow, the feedback signal can be reduced or eliminated.

If the charge pump 315 does not receive the transition information, the charge pump 315 may not generate the feedback voltage and no feedback signal is generated. As a result, the clock control signal controls the delay of the high speed clock signal in the present embodiment. If the charge pump 315 receives the transition information, the charge pump 315 will produce a reduced feedback signal and, as a result, the feedback signal will be reduced thereby allowing the speed of the modified high speed clock signal to increase. In other embodiments, the reduced feedback signal may allow the speed of the modified high speed clock signal to decrease.

The exemplary demux 325 is an inverse multiplexer that allows the serialized data received over the serialized data path 225 to be broken into parallel data and output over parallel data paths 235a through 235j. The modified high speed clock signal from the voltage control delay block 305 controls the demux 325. In some embodiments, every rising clock edge of the modified high speed clock signal triggers the demux 325 to read the serialized data and to write each discrete datum of the serialized data 105 over the parallel data path 240a-240j.

In one example, the serialized data 105 contains ten separate data flows. At the rising edge of the modified high speed clock signal, the demux 325 outputs the first discrete datum over parallel data path 240a. The next rising edge of the modified high speed clock signal triggers the demux 325 to output the second discrete datum over parallel path 240b and so forth until the tenth discrete datum is written over parallel data path 240j. Subsequently, the process can repeat with the next discrete datum written to the parallel path 240a.

Figure 4:
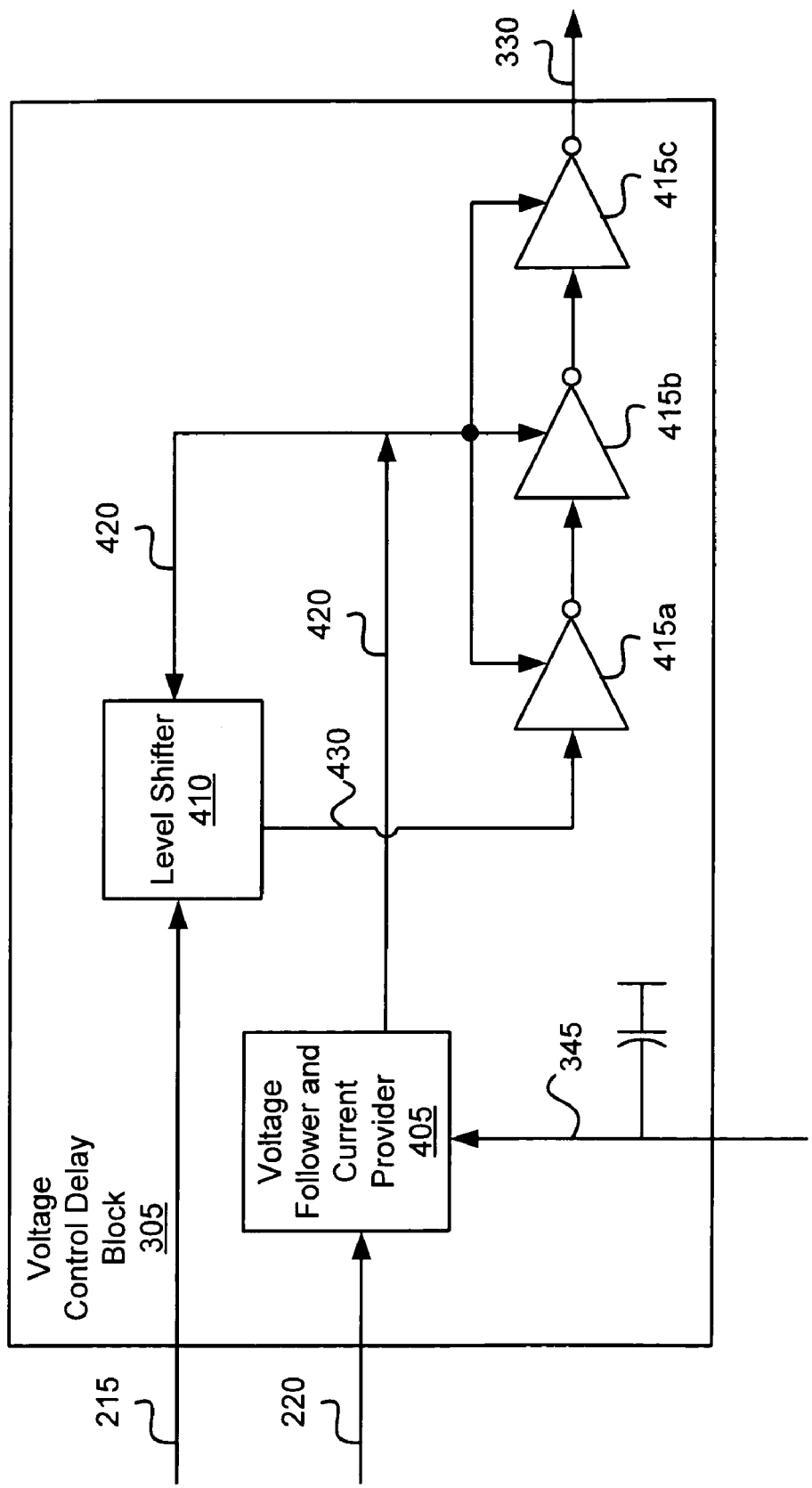
FIG. 4 is a block diagram of an exemplary voltage control delay block in an embodiment of the present invention.

Referring now to FIG. 4, a block diagram of the exemplary voltage control delay block 305 is shown. As discussed in FIG. 3, the voltage control delay block 305 can increase or decrease the speed of the reference high speed clock signal received from the PLL 210 (FIG. 2). By increasing or decreasing the speed of the reference high speed clock signal, the modified high speed clock signal may be configured to optimize restoration of the serialized data 105 (FIG. 1) and reduce errors in reading the serialized data.

A voltage follower and current provider 405 receives the clock control signal over the clock control signal path 220 and the feedback signal over the feedback signal path 345. The voltage follower and current provider 405 generates the modification control signal and forwards the modification control signal over a modification control signal path 420. In exemplary embodiments, the voltage follower and current provider 405 combine the clock control signal and the feedback signal to generate the modification control signal.

A level shifter 410 receives the reference high speed clock signal from the PLL 210 and modification control signal from the voltage follower and current provider 405 over the modification control signal path 420. The exemplary level shifter 410 may alter the level of the voltages received from the reference high speed clock signal and/or the modification control signal. In one example, the level shifter 410 receives a reference high speed clock signal of a voltage between 0 volts and +5 volts. The level shifter 410 may shift the voltage of the reference high speed clock signal to a voltage between −5 volts and +5 volts. The level shifter 410 outputs the shifted high speed clock signal via shifted high speed clock signal path 430.

Delay elements 415a through 415c receive the modification control signal via the modification control signal path 420. In some embodiments, as the voltage increases, the delay of the delay elements 415a through 415c may increase. As a result, the shifted high speed clock signal may be delayed as the shifted high speed clock signal propagates through the delay elements 415a through 415c. In other embodiments, as the voltage decreases, the delay of the delay elements 415a through 415c may decrease. Once the shifted high speed clock signal propagates through the delay elements 415a through 415c, the modified high speed clock signal is formed and is output over the modified high speed clock path 330.

Although three delay elements 415 are depicted in the voltage control delay block 305, there may be any number of delay elements 415. In some embodiments, the delay elements 415 are in an inverter ring structure. The three delay elements 415a through 415c may also be similar to the delay elements contained within the PLL 210 (FIG. 2).

Although the voltage control delay block 305 is termed as "voltage", it will be appreciated that the voltage control delay block 305 can also generate a modified high speed clock signal by using current to control the delay elements 415a through 415c.

Figure 5:
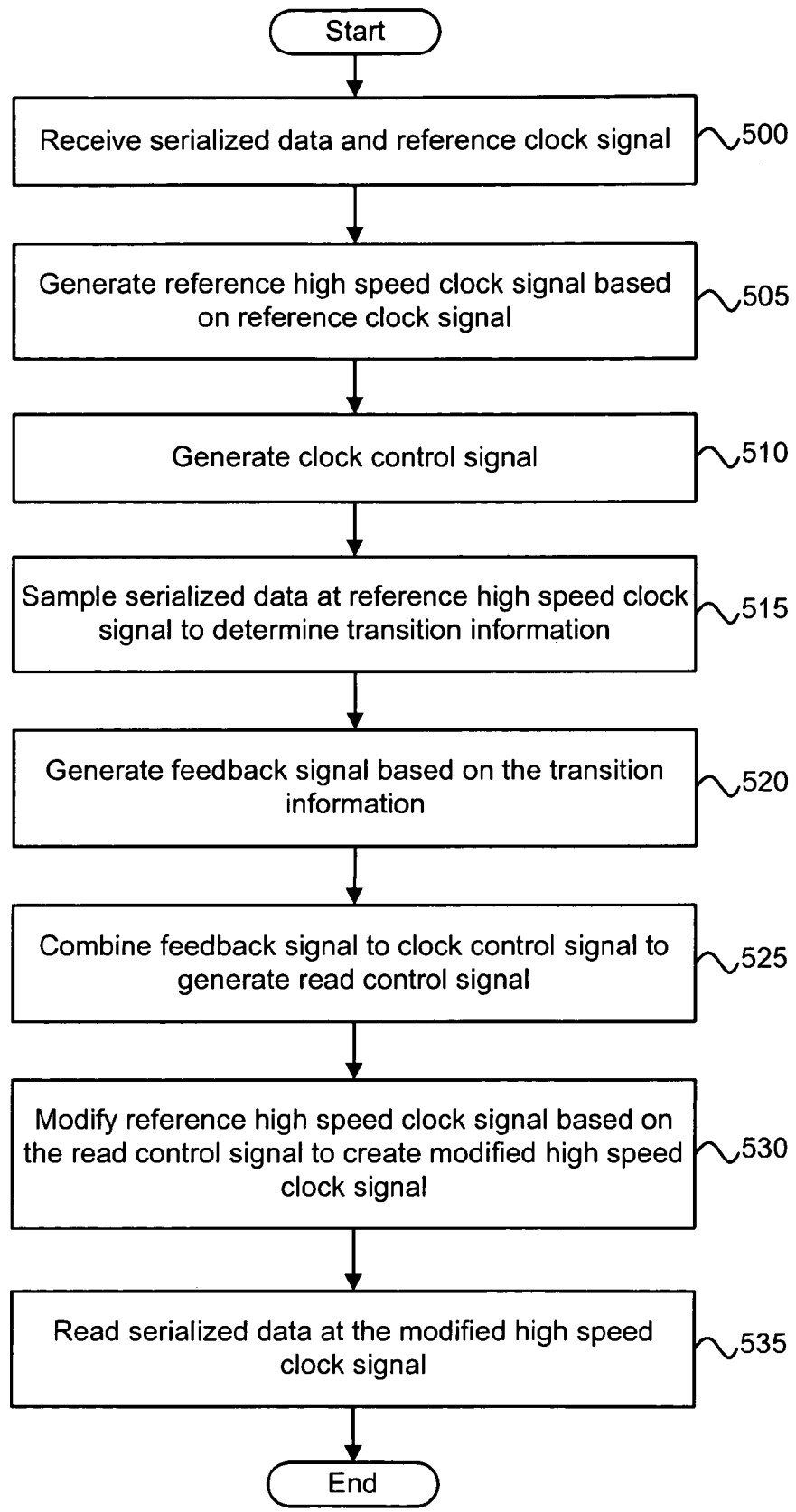
FIG. 5 is a flowchart of an exemplary method for reading serialized data.

Referring now to FIG. 5, a flowchart of an exemplary method for reading serialized data is shown. In step 500, the DLL clock and data recovery module 230 (FIG. 2) receives serialized data 105 and the PLL 210 (FIG. 2) receives the reference clock signal from a digital device. In some embodiments, the serialized data 105 contains a plurality of data flows.

In some embodiments, the reference clock signal may be transmitted as an analog signal to the environment 200 (FIG. 2) where an analog to digital converter converts the reference clock signal to a digital signal. Subsequently, the PLL 210 receives the digital reference clock signal.

In step 505, the PLL 210 generates the reference high speed clock signal based on the reference clock signal. In various embodiments, the PLL 210's bandwidth is set to a predetermined frequency range. Any input jitter (i.e., timing errors) whose bandwidth is less than the predetermined frequency range will be tracked by the PLL 210. As a result, the reference high speed clock signal will also contain the jitter of the reference clock signal. If the serialized data 105 (FIG. 1) and the reference clock signal are generated by the same digital device, then the jitter in the high speed reference clock signal will be in phase with jitter contained within the serialized data 105. In some embodiments, the jitter is canceled by the bang-bang phase detector 310 (FIG. 3) as will be discussed in steps 515 and 520 below.

In step 510, the PLL 210 generates the clock control signal based on the reference clock signal. In some embodiments, the reference clock signal is filtered by a low pass filter within the PLL 210. Subsequently, a clock control signal is determined by a voltage follower and current provider 405. In one example, the voltage of the clock control signal drives an inverter ring structure within the PLL 210 which generates the reference high speed clock signal.

In step 515, the bang-bang phase detector 310 samples the serialized data 105 at the reference high speed clock signal to determine transition information. In some embodiments, the serialized data 105 is sampled at the rising edge of the reference high speed clock signal.

In step 520, the charge pump 315 generates a feedback signal based on the transition information. In some embodiments, the charge pump 315 generates a higher feedback signal when the serialized data 105 is sampled close to a point of transition. In alternative embodiments, the charge pump 315 generates a weaker feedback signal when the serialized data 105 is sampled close to the point of transition. Optionally, the feedback signal may be filtered by a low pass filter 320 (FIG. 3).

In step 525, the voltage control delay block 305 (FIG. 3) combines the feedback signal and the clock control signal to generate the modification control signal. In step 530, the voltage control delay block 305 modifies the reference high speed clock signal from the PLL 210 based on the modification control signal to create the modified high speed clock signal.

In some embodiments, the modified high speed clock signal may be split. The demux 325 (FIG. 3) receives one branch of the modified high speed clock signal. The second branch may loop back through the bang-bang phase detector 310 to determine new transition information and further improve the modified high speed clock signal. In one example, the continuously looped modified high speed clock signal constantly corrects the clock signal. The discrete datum of the serialized data 105 may be read at the rising or falling edge of the modified high speed clock signal thereby allowing each discrete datum to be read between the two points of transition.

In one embodiment, if the bang-bang phase detector 310 determines that the transition information is zero, then the charge pump 315 does not produce a feedback signal. If no feedback signal is received, the voltage control delay block 305 may base the new modified high speed control signal solely upon the clock control signal.

In step 535, the demux 325 reads the serialized data 105 based on the modified high speed clock signal. The demux 325 may write data flows contained within the serialized data 105 to parallel paths 235a through 235j based on the modified high speed clock signal. In some embodiments, the serialized data 105 is written at the rising edge of the modified high speed clock signal. In other embodiments, the serialized data 105 is written at the falling edge of the modified high speed clock signal.

The demux 325 may be configured to generate a system clock signal on system clock signal paths 245a through 245j. In some embodiments, there are an equal number of system clock signal paths 245a through 245j as the number of parallel data paths 235a through 235j. In one example, the demux 325 writes the first discrete datum of the serialized data 105 to the parallel data path 240a upon the rising edge of the modified high speed clock signal. That pulse of the modified high speed clock signal is then transmitted over the first system clock signal path 245a. The demux 325 then writes the second discrete datum to the parallel data path 240b and transmits the second pulse of the modified high speed clock signal over the second system clock signal path 245b and so forth. As a result, each discrete datum over each parallel data path is in phase with a system clock signal.

Figure 6:
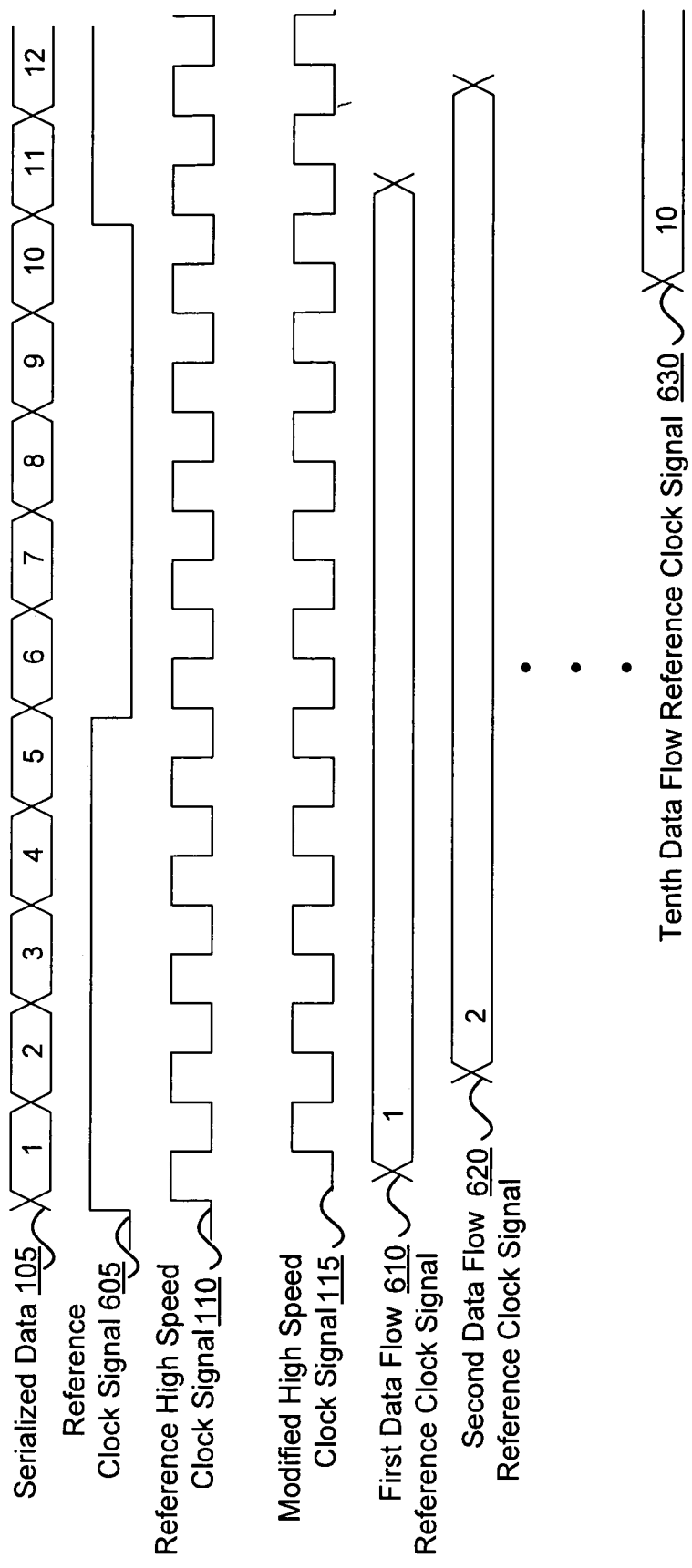
FIG. 6 is a diagram of serialized data and exemplary clock signals in an alternative embodiment of the present invention.

Referring to FIG. 6, a diagram of serialized data 105 and exemplary clock signals in an alternate embodiment of the present invention is shown. Similar to FIG. 1, serialized data 105 contains ten data flows with discrete datum "1" through "12" depicted. There may be any number of discrete data. A reference clock signal 605 is generated by the same source as the serialized data 105. The reference high speed clock signal 110 is generated based on the reference clock signal 605 and is in phase with the serialized data 105. However, the rising edge of the reference high speed clock signal 110 occurs close to the point of transition between discrete datum of the serialized data 105.

The reference high speed clock signal can be modified based on the proximity of the rising edge of the reference high speed clock signal to the points of transition within the serialized data. As successive pulses of the reference high speed clock signal are modified, the rising edge of the modified high speed clock signal 115 can approximate the space between the two points of transition of each discrete datum.

Reference clock signals may also be generated as discrete datum from the serialized data 105 is written. A first data flow reference clock signal 610 may begin at the point that the first discrete datum (e.g., discrete datum "1") is written and continue until a next discrete datum of the data flow is written (e.g., discrete datum "11"). A second data flow reference clock signal 620 may begin at the point that a second discrete datum (e.g., discrete datum "2") is written and continue until the next discrete datum of the data flow is written (e.g., discrete datum "12") and so forth. A last data flow reference clock signal 630 may begin at a point that a tenth discrete datum is written.

The above-described modules can be comprised of instructions that are stored on storage media. The instructions can be retrieved and executed by a processor of a digital device (discussed further herein). Some examples of instructions include software, program code, and firmware. Some examples of storage media comprise memory devices and integrated circuits. The instructions are operational when executed by the processor to direct the processor to operate in accordance with embodiments of the present invention. Those skilled in the art are familiar with instructions, processor(s), and storage media.

The present invention is described above with reference to exemplary embodiments. It will be apparent to those skilled in the art that various modifications may be made and other embodiments can be used without departing from the broader scope of the present invention. Therefore, these and other variations upon the exemplary embodiments are intended to be covered by the present invention.

What is claimed is:

1. A method for restoring serialized data into parallel data, comprising:
   receiving serialized data containing data flows from a data source;
   receiving a reference clock signal from the data source;
   generating a modified high speed clock signal based at least partially on the reference clock signal, wherein generating the modified high speed clock signal comprises:
      generating a reference high speed clock signal based on the reference clock signal;
      sampling the serialized data at the reference high speed clock signal to determine transition information;
      generating a feedback signal based on the transition information; and
      modifying the reference high speed clock signal based at least partially on the feedback signal to generate the modified high speed clock signal; and
   reading the serialized data at a modified high speed clock signal.

2. The method of claim 1 further comprising writing data flows from the serialized data to parallel data paths.

3. The method of claim 2 further comprising generating a system clock signal based on the modified high speed clock signal, wherein the system clock signal is in phase with one of the written data flows.

4. The method of claim 1 further comprising generating a clock control signal based on the reference clock signal.

5. The method of claim 4 wherein modifying the reference high speed clock signal comprises combining the feedback signal and the clock control signal to generate a modification control signal.

6. The method of claim 5 wherein voltages of the clock control signal and the feedback signal are combined to form the modification control signal.

7. The method of claim 5 wherein currents of the clock control signal and the feedback signal are combined to form the modification control signal.

8. The method of claim 1 wherein sampling the serialized data occurs at a rising edge of the reference high speed clock signal.

9. The method of claim 1 wherein reading the serialized data occurs at a rising edge of the modified high speed clock signal.

10. A system for writing data flows contained within serialized data onto parallel paths, comprising:
    a phased lock loop configured to receive a reference clock signal from a data source, generate a reference high speed clock signal based on the reference clock signal, and generate a clock control signal based on the reference clock signal; and
    a dynamic link library clock and data recovery module configured to read data flows contained within serialized data at a modified high speed clock signal based on the reference high speed clock signal and write the data flows onto parallel data paths.

11. The system of claim 10 wherein the dynamic link library clock and data recovery module is further configured to generate a system clock cycle signal based on the modified high speed clock signal, wherein the system clock cycle signal is in phase with at least one of the written data flows.

12. The system of claim 10 wherein the dynamic link library clock and data recovery module comprises:
    a bang-bang phase detector configured to sample the serialized data containing the data flows at the reference high speed clock signal to determine transition information; and
    a charge pump configured to generate a feedback signal based on the transition information.

13. The system of claim 12 wherein sampling the serialized data occurs at a rising edge of the reference high speed clock signal.

14. The system of claim 10 wherein the dynamic link library clock and data recovery module further comprises a voltage control delay block configured to receive a feedback signal from a charge pump, receive the clock control signal from the phased lock loop, combine the feedback signal and the clock control signal to form a modification control signal, and modify the reference high speed clock signal based on the modification control signal to create the modified high speed clock signal.

15. The system of claim 14 wherein the dynamic link library clock and data recovery module further comprises a demultiplexer configured to receive the serialized data, receive the modified high speed clock signal, and write the data flows contained within the serialized data onto parallel data paths based on the modified high speed clock signal.

16. The system of claim 14 further comprising a low pass filter configured to filter the feedback signal.

17. The system of claim 14 wherein voltages of the clock control signal and the feedback signal are combined to form the modification control signal.

18. The system of claim 14 wherein currents of the clock control signal and the feedback signal are combined to form the modification control signal.

19. The system of claim 14 wherein the voltage control delay block comprises:
- a voltage follower and current provider configured to combine the feedback signal and the clock control signal to form the modification control signal;
- a level shifter configured to modify voltage of the reference high speed clock signal based on the modification control signal; and
- an inverter ring structure configured to receive the reference high speed clock signal from the level shifter to form the modified high speed clock signal based on the modification control signal.

20. A system for writing data flows contained within serialized data onto parallel paths, comprising:
- a phased lock loop configured to receive a reference clock signal from a data source, generate a reference high speed clock signal based on the reference clock signal, and generate a clock control signal based on the reference clock signal;
- a means to sample serialized data containing data flows at the reference high speed clock signal to generate a feedback signal;
- a means to modify the reference high speed clock signal based on the feedback signal and the clock control signal to form a modified high speed clock signal; and
- a demultiplexer configured to receive the serialized data, receive the modified high speed clock signal, and write the data flows contained within the serialized data onto parallel data paths based on the modified high speed clock signal.

21. The system of claim 20 further comprising a low pass filter configured to filter the feedback signal.

22. The system of claim 20 wherein the demultiplexer is further configured to generate a system clock cycle based on the modified high speed clock signal, wherein the system clock cycle is in phase with at least one of the data flows.

* * * * *